(12) United States Patent
Triyoso et al.

(10) Patent No.: US 7,071,038 B2
(45) Date of Patent: Jul. 4, 2006

(54) METHOD OF FORMING A SEMICONDUCTOR DEVICE HAVING A DIELECTRIC LAYER WITH HIGH DIELECTRIC CONSTANT

(75) Inventors: Dina H. Triyoso, Austin, TX (US); Olubunmi O. Adetutu, Austin, TX (US); Randy W. Cotton, Pflugerville, TX (US)

(73) Assignee: Freescale Semiconductor, Inc, Austin, TX (US)

( * ) Notice: Subject to any disclaimer, the term of this patent is extended or adjusted under 35 U.S.C. 154(b) by 0 days.

(21) Appl. No.: 10/946,938

(22) Filed: Sep. 22, 2004

(65) Prior Publication Data

US 2006/0063336 A1    Mar. 23, 2006

(51) Int. Cl.
*H01L 21/84* (2006.01)
(52) U.S. Cl. .................. 438/151; 438/197; 438/216; 438/287; 438/585; 438/591; 438/785; 438/787; 438/977; 438/981
(58) Field of Classification Search ............... 438/151, 438/197, 216, 287, 585, 591, 785, 787, 977, 438/981
See application file for complete search history.

(56) References Cited

U.S. PATENT DOCUMENTS 5,985,706 A * 11/1999 Gilmer et al. ............. 438/199
6,103,559 A * 8/2000 Gardner et al. ............. 438/183
6,268,251 B1 * 7/2001 Zhong et al. ................ 438/275
6,716,691 B1 * 4/2004 Evans et al. ................ 438/218

(Continued)

OTHER PUBLICATIONS

Choi, K. et al.; "Initial growth of interfacial oxide during deposition of HfO$_2$ on silicon"; Applied Physics Letters; Jul. 12, 2004; pp. 215-217; vol. 85, No. 2; American Institute of Physics.

Iwasaki, T.; Molecular-dynamics analysis of interfacial diffusion between high=permittivity gate dielectrics and silicon substrates; Journal of Mater. Res.; Apr. 2004; pp. 1197-1202; vol. 19, No. 4; Materials Research Society.

(Continued)

*Primary Examiner*—Lynne A. Gurley
(74) *Attorney, Agent, or Firm*—Robert L. King; Cindy R. Simpson; Joanna G. Chiu

(57) ABSTRACT

A method for forming a semiconductor device (10) creates a dielectric layer (18) with high dielectric constant. An interfacial layer (14) is formed over a semiconductor substrate (12). A dielectric layer (16) is formed over the interfacial layer, wherein the dielectric layer has a high dielectric constant (K). The dielectric layer is thinned, such as by etching or chemical mechanical polishing, wherein a thickness of the thinned dielectric layer is less than a thickness of the dielectric layer prior to thinning. In one form, the method is used to form a transistor having a gate electrode layer formed over the thinned dielectric layer and source/drain diffusions (24, 26) within the semiconductor substrate.

36 Claims, 2 Drawing Sheets

U.S. PATENT DOCUMENTS

| | | | |
|---|---|---|---|
| 6,780,699 B1 * | 8/2004 | Tamura et al. | 438/217 |
| 6,787,421 B1 | 9/2004 | Gilmer et al. | |
| 2005/0280105 A1 * | 12/2005 | Andreoni et al. | 257/410 |
| 2006/0043505 A1 * | 3/2006 | Parekh et al. | 257/413 |

OTHER PUBLICATIONS

Toyoda, S. et al. "Effects of interlayer and annealing on chemical states of $HfO_2$ gate insulators studied by photoemission spectroscopy"; Applied Physics Letters; Mar. 29, 2004; pp. 2328-2330; vol. 84, No. 13; American Institute of Physics.

Conard, T. et al.; "TOF-SIMS as a rapid diagnostic tool to monitor the growth mode of thin (high k) films"; Applied Surface Science 203-204; 2003; pp. 400-403; Elsevier Science B.V.

* cited by examiner

METHOD OF FORMING A SEMICONDUCTOR DEVICE HAVING A DIELECTRIC LAYER WITH HIGH DIELECTRIC CONSTANT

FIELD OF THE INVENTION

This invention relates generally to semiconductors, and more specifically, to making semiconductor devices having very small dimensions.

BACKGROUND OF THE INVENTION

Transistors have a dielectric layer that electrically isolates a gate electrode from a channel typically positioned in a substrate. The dielectric is desired to have low gate current leakage. A common dielectric layer material is silicon dioxide. Silicon dioxide has a dielectric constant of approximately 3.9. Future generation devices require reduction in the silicon dioxide gate dielectric thickness. Reducing the gate dielectric thickness typically increases the gate current leakage.

As silicon dioxide gate dielectric layers are made thinner, a problem with controlling the uniformity of the thickness of the layer and controlling the manufacturing reliability becomes more difficult. As a result, materials having a higher dielectric constant than silicon dioxide have been proposed as a replacement of the silicon dioxide. Others have recognized that a thin silicon dioxide based interface is required beneath a higher dielectric constant material to improve electron and hole mobility in the transistor channel. This silicon dioxide based interfacial layer between the substrate and the higher dielectric constant material can be formed by either: (1) a chemical oxide grown during a chemical cleaning of the substrate; (2) formation of a deposited or thermally grown silicon dioxide layer; or (3) formation during the deposition of the high dielectric constant material itself as a result of oxygen coming into contact with a silicon substrate.

BRIEF DESCRIPTION OF THE DRAWINGS

The present invention is illustrated by way of example and not limitation in the accompanying figures, in which like references indicate similar elements.

FIGS. 1–5 illustrate in cross-sectional form a semiconductor device having a layer with a high dielectric constant in accordance with the methods described herein.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Illustrated in FIG. 1 is a semiconductor device 10 having a substrate 12 with a portion that is electrically isolated by isolation regions 11. In one form the substrate 12 is bulk silicon although other materials such as germanium, gallium, gallium arsenide, etc. may be used. Additionally, it should be understood that substrate 12 may alternatively be a layer positioned on a support layer or may be silicon on an insulator, SOI. Overlying substrate 12 and isolation regions 11 is an interfacial layer 13. The interfacial layer 13 is, in one form, an oxide of the substrate material. Where substrate 12 is silicon the interfacial layer 13 is silicon dioxide ($SiO_2$). In one form the interfacial layer 13 is formed by growing silicon dioxide as a result of a chemical reaction during the silicon substrate cleaning step. In another form the interfacial layer 13 is formed by deposition. In the formation by deposition, at least a silicon-containing gas, for example silane or dichlorosilane, etc., and an oxygen-containing gas are used in combination to form the silicon dioxide. In yet another form, the interfacial layer 13 is grown in which the $SiO_2$ is formed from a silicon substrate. Optionally, if the thickness of the interfacial layer 13 is desired to be reduced from the depth initially formed, an optional isotropic-type etch of the interfacial layer 13 may be implemented. This isotropic-type etch may be either a wet etch or a dry etch. While the present discussion will assume that silicon dioxide is the material used to implement interfacial layer 13, it should be understood that other dielectric materials may be implemented. In the illustrated form the interfacial layer 13 is grown or deposited to a depth of 1 nanometer or less.

Illustrated in FIG. 2 is further processing of semiconductor device 10. A high dielectric constant (high K) layer 16 is formed overlying the interfacial layer 13 which is now illustrated as interfacial layer 14. The high dielectric constant layer 16 is implemented as a metal oxide, a metal silicate or a metal aluminate or a combination thereof. In one form, a metal oxide that is used is hafnium oxide, $HfO_2$. However, numerous other high dielectric constant metal aluminates, metal oxides, metal silicates, a metal oxynitride and a metal silicon oxynitride may be formed. The metal in such aluminates, oxides, silicates and oxynitrides may include aluminum, titanium, tantalum, yttrium, zirconium, hafnium, lanthanum (and other rare earth metals) and combinations thereof. As used herein, the term "high dielectric constant" and "high K" means a dielectric constant that is greater than the dielectric constant of silicon dioxide which is about 3.9. The high dielectric constant layer 16 is formed by deposition. Any of several deposition methods may be used including Atomic Layer Deposition (ALD), Chemical Vapor Deposition (CVD), Physical Vapor Deposition (PVD), spin-on deposition, electroplating and electroless plating by deposition of a metal or composites of metals and oxidizing in an oxygen-containing gas. Atomic layer deposition permits accurate control of the depth of the deposition and is also very conformal. Because some of the metal atoms of the high dielectric constant layer 16 may incorporate into the interfacial layer 13, the composition of interfacial layer 13 differs from interfacial layer 14. The interfacial layer 14 may have a metal composition whereas the interfacial layer 13 may not.

An important characteristic of the high dielectric constant layer 16 is the thickness of the high dielectric constant layer 16. We have discovered that it is important to form the high dielectric constant layer 16 with a minimum thickness. For example, the high dielectric constant layer 16 should be formed having a depth of substantially from around 5 nanometers to 20 nanometers. Thermal treatment such as a Post Deposition Anneal (PDA) of the high dielectric constant layer 16 is required after the formation of the high dielectric constant layer 16 on the interfacial layer 13. The thermal processing or thermal treatment is necessary to densify or reduce imperfections such as charge traps in the high dielectric constant layer 16. Such charge traps result in electrical degradation of the semiconductor device 10. Therefore, by performing an anneal at a temperature having a value anywhere within a wide range from approximately two hundred up to or even above one thousand degrees Celsius, the composition of the high dielectric constant layer 16 is smoothed and the charge traps are minimized. However, if the depth of the high dielectric constant layer 16 is significantly less than 5 nanometers, annealing of the high dielectric constant layer 16 causes the silicon dioxide of the interfacial layer 14 to grow significantly. The increased thickness of the silicon dioxide therefore lowers the dielectric constant of the composite dielectric. We have discovered that the annealing has a minimal effect on the underlying silicon dioxide when the high dielectric constant layer 16 is formed with a thickness substantially in the range of 5 nanometers to 20 nanometers. Furthermore, the microstructure or crystallinity of some of the materials described herein as being used for the high dielectric constant layer 16 is thickness dependent and a thicker deposited layer is therefore advantageous. For example, the microstructure or crystallinity of hafnium oxide is thickness dependent. An additional advantage of forming the high dielectric constant layer 16 thicker is that a thicker high k gate dielectric film may have more desirable properties than an originally formed thinner film. In other words, there are preferred bulk film properties for thick films and the thick films can be isotropically etched to obtain thin films rather than to form thin films directly.

Figure 1:
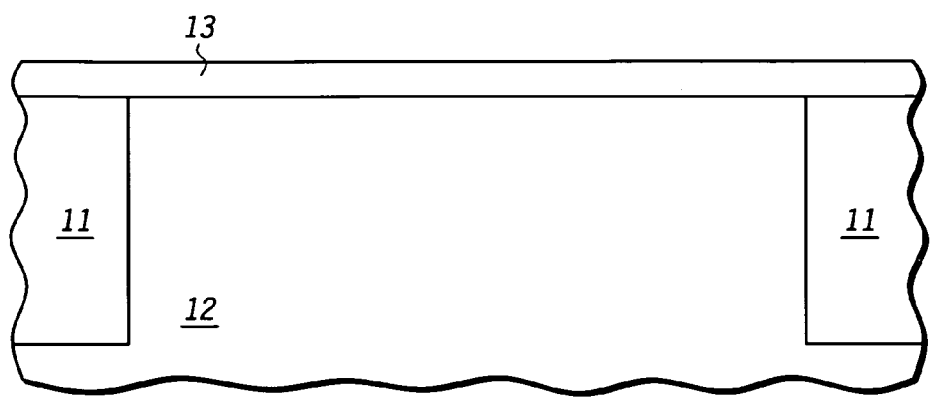
Figure 2:
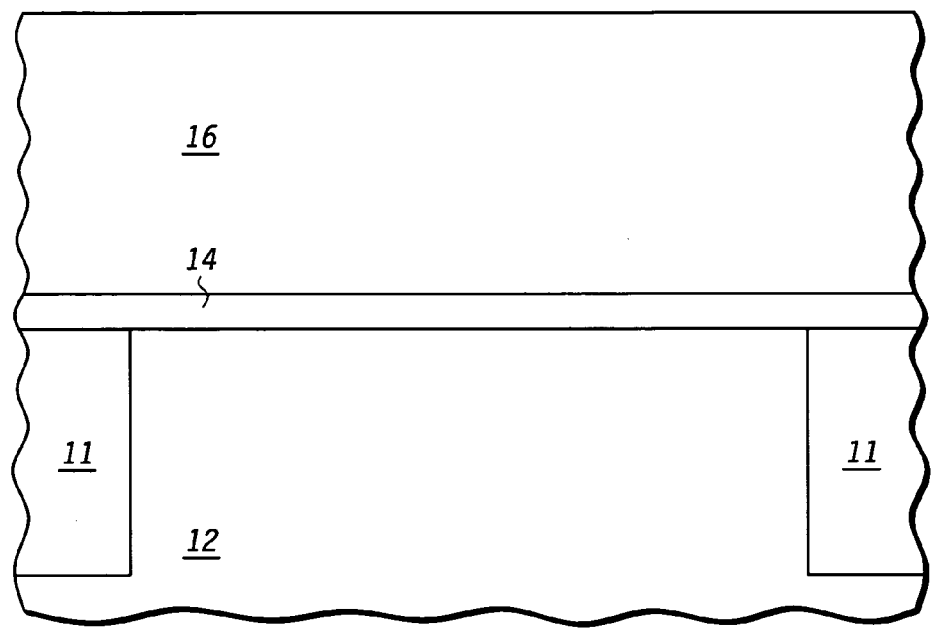
Figure 3:
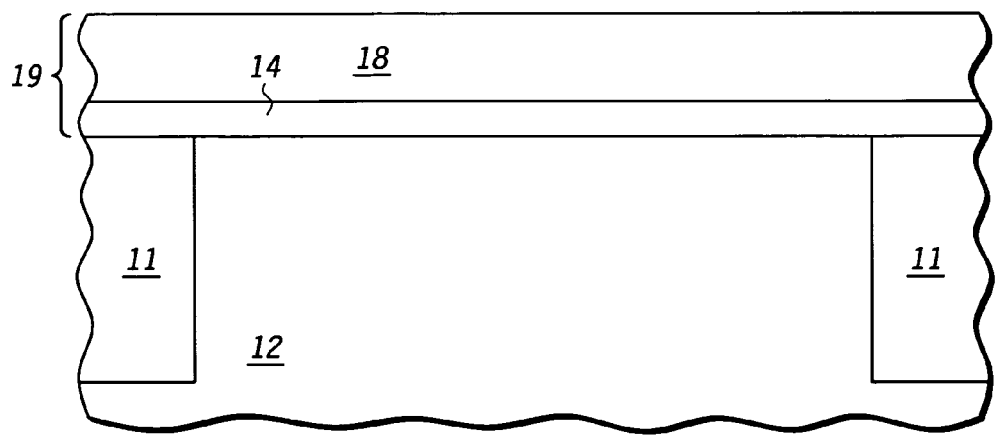

Illustrated in FIG. 3 is further processing of semiconductor device 10. The high dielectric constant layer 16 is isotropically etched or thinned down to a depth of substantially 3 nanometers or less to form a thin high dielectric constant layer 18. In one form the etching or thinning down of the high dielectric constant layer 16 is performed by implementing a chemical wet etch with phosphoric acid as one of the etchants. Alternatively, an etching or thinning process may be performed by implementing an isotropic plasma dry etch. Yet another method to thin down the high dielectric constant layer 16 is an isotropic thermal dry etch of semiconductor device 10 in a reducing gas. For example, the semiconductor device 10 may be annealed in a hydrochloric acid (HCl) gas at a temperature greater than approximately four hundred degrees Celsius. Yet another method to thin the high dielectric constant layer 16 is by Chemical Mechanical Polishing (CMP) of the high dielectric constant layer 16.

Therefore, the interfacial layer 14 and the thin high dielectric constant layer 18 form a composite dielectric layer 19. By forming the composite dielectric layer 19 through a method wherein a much thicker high dielectric constant layer is initially created, an anneal to cure the high dielectric constant layer material may be performed without growing or modifying the underlying interfacial layer 14 substantially. After the annealing of the high dielectric constant layer 16 occurs, the high dielectric constant layer 16 is then etched to a desired depth to form a desired equivalent oxide thickness (EOT).

Figure 4:
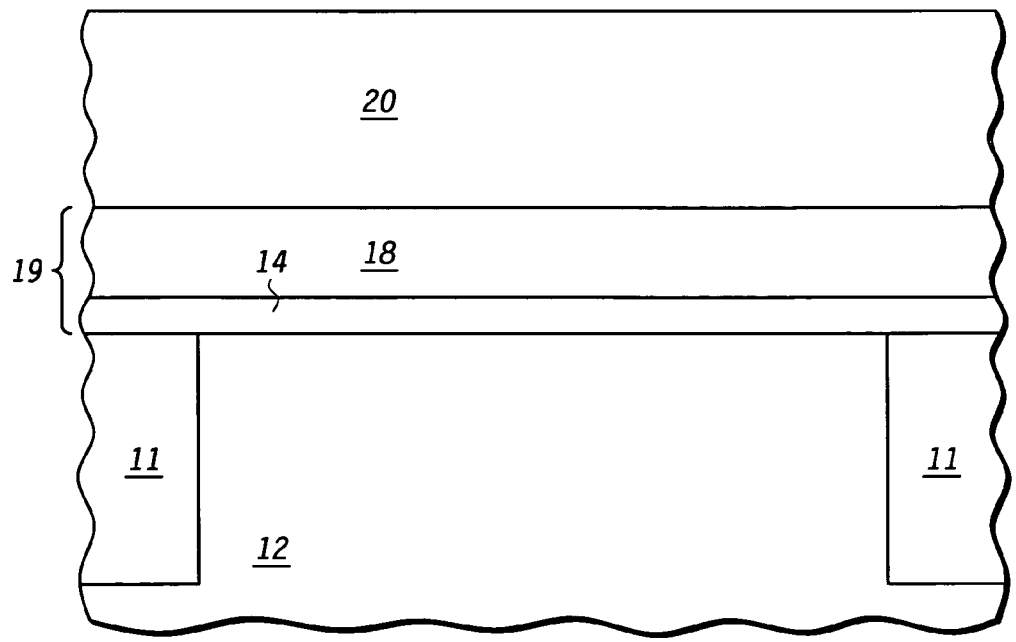

Illustrated in FIG. 4 is further processing of semiconductor device 10. A conductive layer 20 is deposited overlying the composite dielectric layer 19. In one form, the deposition technique that is used is ALD. The conductive layer 20 may be any conductive material including a metal, and may be any of numerous types of metals implemented in semiconductors. The conductive layer 20 is used as a structural element of semiconductor device 10.

Figure 5:
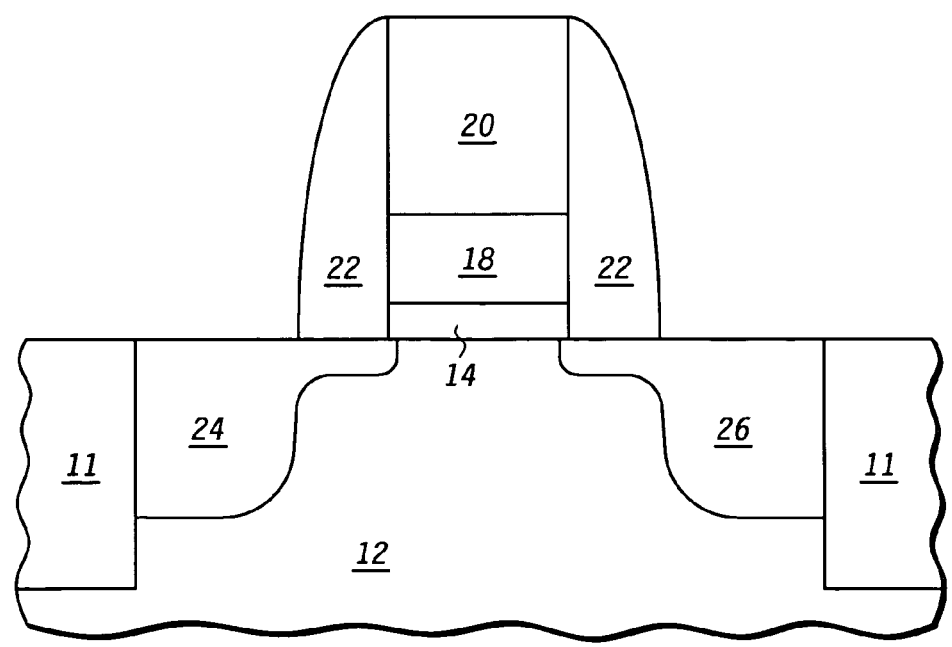

Illustrated in FIG. 5 is further processing of semiconductor device 10 to form the completed device. The conductive layer 20, thin high dielectric constant layer 18 and interfacial layer 14 are patterned and etched to form a gate stack for a transistor. The gate stack overlies a channel for semiconductor device 10. Conventional sidewall spacers 22 are formed lateral to the gate stack. A source diffusion 24 and a drain diffusion 26 are formed adjacent the gate stack with the sidewall spacers 22 being used to implement lightly doped drain (LDD) structures. Therefore, semiconductor device 10 is a completed transistor structure. The transistor structure is formed using a method to form a gate dielectric having a high dielectric constant.

By now it should be appreciated that there has been provided a semiconductor method for depositing a thin high dielectric constant layer while maintaining a thin interfacial layer in the form of interfacial layer 14. In one form there is provided herein a method for forming a semiconductor device. A semiconductor substrate is provided. An interfacial layer is formed over the semiconductor substrate. A dielectric layer is formed over the interfacial layer, wherein the dielectric layer has a high dielectric constant (K). The dielectric layer is thinned, wherein a thickness of the thinned dielectric layer is less than a thickness of the dielectric layer prior to thinning. A gate electrode layer is formed over the thinned dielectric layer. In another form a thickness of the interfacial layer does not substantially change during the forming of the dielectric layer. In another form the forming of the dielectric layer uses at least one of atomic layer deposition (ALD), chemical vapor deposition (CVD), or physical vapor deposition (PVD), spin-on deposition, plating, electroless plating or oxidation of a metal or metal composites. In another form the interfacial layer has a thickness in a range of approximately 0.3 to 1.2 nanometers. In yet another form the thickness of the dielectric layer prior to thinning is at least approximately 5 nanometers. In yet another form the thickness of the dielectric layer prior to thinning is at least approximately 10 nanometers. In yet another form the thickness of the thinned dielectric layer is at most 3 nanometers. In yet another form the dielectric layer includes at least one of a metal oxide, a metal silicate, a metal aluminate, a metal oxynitride and a metal silicon oxynitride. In another form, during the forming of the dielectric layer, metal from the dielectric layer penetrates into at least a portion of the interfacial layer. In yet another form the thinned dielectric layer includes a polycrystalline metal oxide. In yet another form a thermal treatment is performed before or after the thinning the dielectric layer. In yet another form the interfacial layer is formed with at least one of a chemical oxide or a thermally grown oxide. In another form the interfacial layer is formed by thermally growing an oxide layer and etching the oxide layer to form the interfacial layer. In yet another form the interfacial layer includes an oxide of the substrate. In yet another form the interfacial layer includes the oxide of the substrate and a metal from the dielectric layer. In yet another form the thinning of the dielectric layer includes performing at least one of a wet etch or a dry etch. In yet another form the interfacial layer, the thinned dielectric layer, and the gate electrode layer are patterned to form a substantially completed semiconductor device.

In another form there is herein provided a method for forming a semiconductor device. A silicon substrate is provided. An interfacial layer is formed over the silicon substrate. A hafnium oxide layer is formed over the interfacial layer. The hafnium oxide layer is etched to thin the hafnium oxide layer. A gate electrode layer is formed over the thinned hafnium oxide layer. In another form a thickness of the interfacial layer does not substantially change during the forming the hafnium oxide. In another form prior to the forming of the hafnium oxide layer, the interfacial layer includes silicon dioxide and after the forming the hafnium oxide layer, the interfacial layer includes a metal silicate. In another form the hafnium oxide layer is a polycrystalline hafnium oxide layer. In another form the hafnium oxide layer is etched by using hydrochloric acid or phosphoric acid or can be removed by CMP. In another form prior to the etching of the hafnium oxide layer, the hafnium oxide layer has a thickness of at least approximately 5 nanometers, and after the etching the hafnium oxide layer, the thinned hafnium oxide layer has a thickness of at most approximately 3 nanometers. In yet another form the interfacial layer has a thickness of in a range of approximately 0.3 to 1.2 nanometers. In yet another form a thermal treatment is performed before or after the etching the dielectric layer. In another form the hafnium oxide layer is formed by using at least one of atomic layer deposition (ALD), Chemical Vapor Deposition (CVD), physical vapor deposition (PVD), spin-on and plating.

In yet another form there is provided a method for forming a semiconductor device by providing a semiconductor substrate and forming an interfacial layer over the semiconductor substrate. The interfacial layer has a thickness in a range of approximately 0.3 to 1.2 nanometers. A dielectric layer is formed over the interfacial layer, wherein the dielectric layer has a high dielectric constant (K) and a thickness of at least approximately 5 nanometers. The dielectric layer is thinned to a thickness of at most approximately 3 nanometers. A gate electrode layer is formed over the thinned dielectric layer. In one form the thickness of the dielectric layer prior to the thinning is at least approximately 10 nanometers. In another form the thickness of the dielectric layer prior to the thinning is at least approximately 20 nanometers. In yet another form a thickness of the interfacial layer does not substantially change during the forming of the dielectric layer. In yet another form the dielectric layer includes at least one of a metal oxide, a metal silicate, a metal oxynitride, a metal silicon oxynitride or a metal aluminate. In another form during the forming of the dielectric layer, metal from the dielectric layer penetrates into at least a portion of the interfacial layer. In yet another form the thinned dielectric layer is a polycrystalline metal oxide. In yet another form the interfacial layer is an oxide of the substrate. In another form after the formation of the dielectric layer, the interfacial layer includes the oxide of the substrate and a metal from the dielectric layer. In yet another form the thinning of the dielectric layer includes performing at least one of a wet etch or a dry etch.

In the foregoing specification, the invention has been described with reference to specific embodiments. However, one of ordinary skill in the art appreciates that various modifications and changes can be made without departing from the scope of the present invention as set forth in the claims below. For example, the metal oxide layer may be implemented with hafnium doped with higher k materials such as titanium or lanthanum. Any multiple metal oxides may be used rather than a single metal oxide. Although a transistor structure is implemented in the illustrated form, other semiconductor structures such as a capacitor may be implemented. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A method for forming a semiconductor device, comprising:
    providing a semiconductor substrate;
    forming an interfacial layer over the semiconductor substrate;
    forming a dielectric layer over the interfacial layer, wherein the dielectric layer has a high dielectric constant (K);
    thinning the dielectric layer to form a thinned dielectric layer, wherein a thickness of the thinned dielectric layer is less than a thickness of the dielectric layer prior to thinning;
    forming a conductive layer overlying the thinned dielectric layer; and
    patterning and etching the interfacial layer, the thinned dielectric layer, and the conductive layer to form a gate stack for a semiconductor device.

2. The method of claim 1, wherein a thickness of the interfacial layer does not substantially change during the forming of the dielectric layer.

3. The method of claim 1, wherein the forming the dielectric layer uses at least one of atomic layer deposition (ALD), chemical vapor deposition (CVD), physical vapor deposition (PVD), spin-on deposition, plating, electroless plating or oxidation of a metal or metal composites.

4. The method of claim 1, wherein the interfacial layer has a thickness in a range of approximately 0.3 to 1.2 nanometers.

5. The method of claim 1, wherein the thickness of the dielectric layer prior to thinning is at least approximately 5 nanometers.

6. The method of claim 1, wherein the thickness of the dielectric layer prior to thinning is at least approximately 10 nanometers.

7. The method of claim 1, wherein the thickness of the thinned dielectric layer is at most 3 nanometers.

8. The method of claim 1, wherein the dielectric layer comprises at least one of a metal oxide, a metal silicate, a metal aluminate, a metal oxynitride or a metal silicon oxynitride.

9. The method of claim 8, wherein during the forming of the dielectric layer, metal from the dielectric layer penetrates into at least a portion of the interfacial layer.

10. The method of claim 1, wherein the thinned dielectric layer comprises a polycrystalline metal oxide.

11. The method of claim 1, further comprising performing a thermal treatment before or after the thinning the dielectric layer.

12. The method of claim 1, wherein forming the interfacial layer comprises at least one of a chemical oxide, a thermally grown oxide, or a deposited oxide.

13. The method of claim 1, wherein forming the interfacial layer comprises:

thermally growing an oxide layer; and
etching the oxide layer to form the interfacial layer.

14. The method of claim 1, wherein the interfacial layer comprises an oxide of the semiconductor substrate.

15. The method of claim 14, wherein after the forming the dielectric layer, the interfacial layer comprises the oxide of the semiconductor substrate and a metal from the dielectric layer.

16. The method of claim 1, wherein the thinning the dielectric layer comprises performing at least one of a wet etch, a dry etch or chemical mechanical polishing (CMP) of the dielectric layer.

17. The method of claim 1, further comprising:
patterning the interfacial layer, the thinned dielectric layer, and the gate electrode layer to form a substantially completed semiconductor device.

18. A method for forming a semiconductor device, comprising:
providing a silicon substrate;
forming an interfacial layer over the silicon substrate;
forming a hafnium oxide layer over the interfacial layer;
etching the hafnium oxide layer to thin the hafnium oxide layer and form a thinned hafnium oxide layers;
forming a conductive layer overlying the thinned hafnium oxide layer; and
patterning and etching the interfacial layer, the thinned hafnium oxide layer, and the conductive layer to form a gate stack for a semiconductor device.

19. The method of claim 18, wherein a thickness of the interfacial layer does not substantially change during the forming the hafnium oxide.

20. The method of claim 18, wherein prior to the forming the hafnium oxide layer, the interfacial layer comprises silicon dioxide and after the forming the hafnium oxide layer, the interfacial layer comprises a metal silicate.

21. The method of claim 18, forming the hafnium oxide layer comprises forming a polycrystalline hafnium oxide layer.

22. The method of claim 18, wherein the etching the hafnium oxide layer comprises using hydrochloric acid or phosphoric acid.

23. The method of claim 18, wherein prior to the etching the hafnium oxide layer, the hafnium oxide layer has a thickness of at least approximately 5 nanometers, and after the etching the hafnium oxide layer, the thinned hafnium oxide layer has a thickness of at most approximately 3 nanometers.

24. The method of claim 18, wherein the interfacial layer has a thickness of in a range of approximately 0.3 to 1.2 nanometers.

25. The method of claim 18, further comprising performing a thermal treatment before or after the etching the hafnium oxide layer.

26. The method of claim 18, wherein forming the hafnium oxide layer uses at least one of atomic layer deposition (ALD), chemical vapor deposition (CVD), physical vapor deposition (PVD), spin-on or plating.

27. A method for forming a semiconductor device, comprising:
providing a semiconductor substrate;
forming an interfacial layer over the semiconductor substrate, the interfacial layer having a thickness in a range of approximately 0.3 to 1.2 nanometers;
forming a dielectric layer over the interfacial layer, wherein the dielectric layer has a high dielectric constant (K) and a thickness of at least approximately 5 nanometers;
thinning the dielectric layer to a thickness of at most approximately 3 nanometers to form a thinned dielectric layer,
forming a conductive layer overlying the thinned dielectric layer; and
patterning and etching the interfacial layer, the thinned dielectric layer, and the conductive layer to form a gate stack for a semiconductor device.

28. The method of claim 27, wherein the thickness of the dielectric layer prior to the thinning is at least approximately 10 nanometers.

29. The method of claim 27, wherein the thickness of the dielectric layer prior to the thinning is at least approximately 20 nanometers.

30. The method of claim 27, wherein a thickness of the interfacial layer does not substantially change during the forming the dielectric layer.

31. The method of claim 27, wherein the dielectric layer comprises at least one of a metal oxide, a metal silicate, a metal aluminate, a metal oxynitride or a metal silicon oxynitride.

32. The method of claim 31, wherein during the forming of the dielectric layer, metal from the dielectric layer penetrates into at least a portion of the interfacial layer.

33. The method of claim 27, wherein the thinned dielectric layer comprises a polycrystalline metal oxide.

34. The method of claim 27, wherein the interfacial layer comprises an oxide of the semiconductor substrate.

35. The method of claim 34, wherein after formation of the dielectric layer, the interfacial layer comprises the oxide of the semiconductor substrate and a metal from the dielectric layer.

36. The method of claim 27, wherein thinning of the dielectric layer comprises performing at least one of a wet etch, a dry etch or chemical mechanical polishing of the dielectric layer.

* * * * *